United States Patent
Hayashi et al.

(10) Patent No.: US 11,652,000 B2
(45) Date of Patent: May 16, 2023

(54) SEMICONDUCTOR DEVICE, METHOD OF MANUFACTURING SEMICONDUCTOR DEVICE, AND METHOD OF RECYCLING SUBSTRATE

(71) Applicant: Kioxia Corporation, Tokyo (JP)

(72) Inventors: Hidekazu Hayashi, Yokkaichi (JP); Mie Matsuo, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/197,232

(22) Filed: Mar. 10, 2021

(65) Prior Publication Data

US 2022/0059408 A1 Feb. 24, 2022

(30) Foreign Application Priority Data

Aug. 19, 2020 (JP) .............................. JP2020-138800

(51) Int. Cl.
*H01L 21/00* (2006.01)
*H01L 21/78* (2006.01)
(Continued)

(52) U.S. Cl.
CPC .... *H01L 21/7813* (2013.01); *H01L 21/02694* (2013.01); *H01L 21/187* (2013.01); *H01L 27/11526* (2013.01); *H01L 27/11556* (2013.01)

(58) Field of Classification Search
CPC .......................... H01L 21/7813; H01L 21/187
See application file for complete search history.

(56) References Cited

U.S. PATENT DOCUMENTS 6,214,701 B1 * 4/2001 Matsushita ....... H01L 21/76259
438/455
6,375,738 B1 * 4/2002 Sato .................. H01L 21/76259
117/89
(Continued)

FOREIGN PATENT DOCUMENTS

JP 2003-249631 A 9/2003
JP 2007-81422 A 3/2007
(Continued)

OTHER PUBLICATIONS

Ohmi et al., "Water Jet Splitting of Thin Porous Si for ELTRAN", Extended Abstracts of the 1999 International Conference on Solid State Devices and Materials, Tokyo, 1999, 2 pages.
(Continued)

*Primary Examiner* — Reema Patel
(74) *Attorney, Agent, or Firm* — Oblon, McClelland, Maier & Neustadt, L.L.P.

(57) ABSTRACT

In one embodiment, a method of manufacturing a semiconductor device includes forming a first semiconductor layer including impurity atoms with a first density, on a first substrate, forming a second semiconductor layer including impurity atoms with a second density higher than the first density, on the first semiconductor layer, and forming a porous layer resulting from porosification of at least a portion of the second semiconductor layer. The method further includes forming a first film including a device, on the porous layer, providing a second substrate provided with a second film including a device, and bonding the first and second substrates to sandwich the first and second films. The method further includes separating the first and second substrates from each other such that a first portion of the porous layer remains on the first substrate and a second portion of the porous layer remains on the second substrate.

14 Claims, 10 Drawing Sheets

(51) Int. Cl.
*H01L 21/18* (2006.01)
*H01L 21/02* (2006.01)
*H01L 27/11526* (2017.01)
*H01L 27/11556* (2017.01)

(56) References Cited

U.S. PATENT DOCUMENTS

| | | |
|---|---|---|
| 7,626,200 B2 | 12/2009 | Tayanaka |
| 8,921,239 B2 | 12/2014 | Belle |
| 2003/0087503 A1* | 5/2003 | Sakaguchi .......... H01L 21/3226 257/E21.32 |
| 2013/0214374 A1* | 8/2013 | Kokumai ............ H01L 27/1464 257/443 |

FOREIGN PATENT DOCUMENTS

| | | |
|---|---|---|
| JP | 4554180 B2 | 9/2010 |
| JP | 4770706 B2 | 9/2011 |
| JP | 5678092 B2 | 2/2015 |
| WO | WO 2007/007537 A1 | 1/2007 |

OTHER PUBLICATIONS

Yonehara et al., "Epitaxial layer transfer by bond and etch back of porous Si", Appl. Phys. Lett., vol. 64, No. 16, https://doi.org/10.1063/1.111698 , (1994), 4 pages.

Yonehara et al., "ELTRAN®; Novel SOI Wafer Technology", JSAP International, http://www.canon.com/eltran/ No. 4, Jul. 2001, 7 pages.

* cited by examiner ly of the prior Japanese Patent Application No. 2020-138800, filed on Aug. 19, 2020, the entire contents of which are incorporated herein by reference.

FIELD

Embodiments described herein relate to a semiconductor device, a method of manufacturing a semiconductor device, and a method of recycling a substrate.

BACKGROUND

It is considered that substrates are bonded to sandwich layers on these substrates, and then one substrate is peeled off from the other substrate and these layers to separate the substrates from each other. In this case, it is desirable to employ a method for separating the substrates from each other in a favorable manner.

DETAILED DESCRIPTION

Embodiments will now be explained with reference to the accompanying drawings. In FIGS. 1A to 10, components that are identical to each other are provided with a same sign and overlapping description thereof will be omitted.

In one embodiment, a method of manufacturing a semiconductor device includes forming a first semiconductor layer including impurity atoms with a first density, on a first substrate, forming a second semiconductor layer including impurity atoms with a second density that is higher than the first density, on the first semiconductor layer, and forming a porous layer resulting from porosification of at least a portion of the second semiconductor layer. The method further includes forming a first film including a first device, on the porous layer, providing a second substrate provided with a second film including a second device, and bonding the first substrate and the second substrate to sandwich the first film and the second film. The method further includes separating the first substrate and the second substrate from each other such that a first portion of the porous layer remains on the first substrate and a second portion of the porous layer remains on the second substrate.

First Embodiment

FIGS. 1A to 4C are sectional views illustrating a method of manufacturing a semiconductor device of a first embodiment. In the present embodiment, a semiconductor device is manufactured by bonding a wafer 1 and a wafer 2, which will be described later.

In FIGS. 1A to 4C, an X-direction, a Y-direction and a Z-direction perpendicular to one another are indicated. In this specification, a +Z-direction is regarded as an upward direction and a −Z-direction is regarded as a downward direction. The −Z-direction may coincide with the gravity direction or may not coincide with the gravity direction.

Figure 1C:
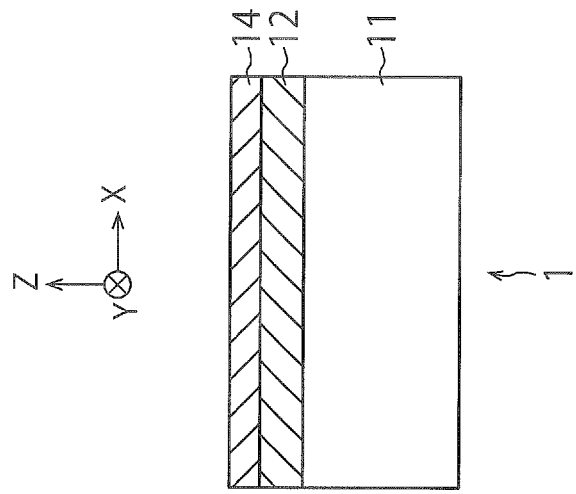
FIGS. 1A to 4C are sectional views illustrating a method of manufacturing a semiconductor device of a first embodiment.
Figure 1B:
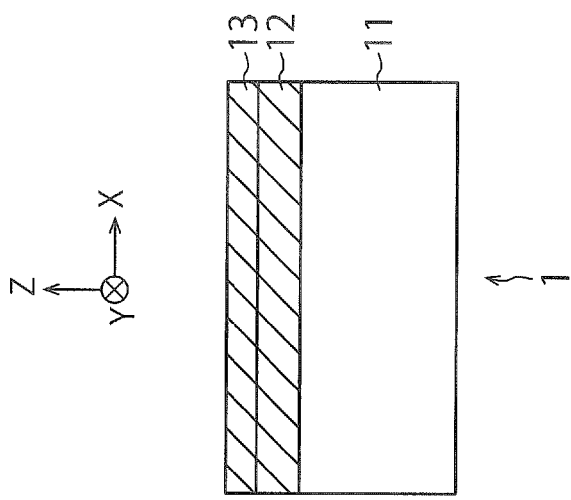
Figure 1A:
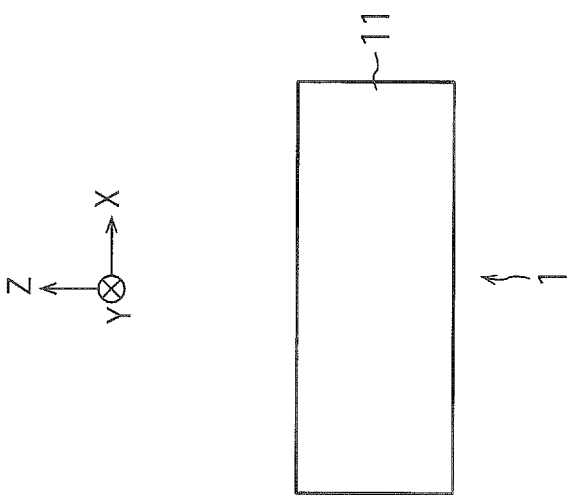

First, a substrate 11 for a wafer 1 is provided (FIG. 1A). The substrate 11 is, for example, a semiconductor substrate such as a silicon substrate. Although the substrate 11 of the present embodiment is a p-type substrate including B (boron) atoms as p-type impurity atoms, the substrate 11 may be a p-type substrate including other p-type impurity atoms (for example, As (arsenic) atoms) or may be an n-type substrate including n-type impurity atoms (for example, P (phosphorus) atoms or Al (aluminum) atoms). The substrate 11 is an example of "first substrate".

Next, a semiconductor layer 12 and a semiconductor layer 13 are sequentially formed on the substrate 11 (FIG. 1B). The semiconductor layer 12 is, for example, an impurity atom-doped layer including a semiconductor element. An example of the semiconductor element is Si (silicon element), and an example of the impurity atoms is p-type impurity atoms such as B atoms. The semiconductor layer 12 is, for example, an impurity atom-doped, monocrystalline silicon, polysilicon or amorphous silicon layer. The semiconductor layer 13 is, for example, an impurity atom-doped layer including a semiconductor element. An example of the semiconductor element is Si and an example of the impurity atoms is p-type impurity atoms such as B atoms. The semiconductor layer 13 is, for example, an impurity atom-doped, monocrystalline silicon, polysilicon or amorphous silicon layer. The semiconductor layer 12 and the semiconductor layer 13 include impurity atoms of a same kind (element) such as B atoms but may include different kinds of impurity atoms. One or each of the semiconductor layer 12 and the semiconductor layer 13 may include p-type impurity atoms other than B atoms (for example, As atoms) or may include n-type impurity atoms (for example, P atoms or Al atoms). The semiconductor layer 12 is an example of "first semiconductor layer". The semiconductor layer 13 is an example of "second semiconductor layer".

The semiconductor layer 12 and the semiconductor layer 13 of the present embodiment have different impurity densities. More specifically, the density of the impurity atoms in the semiconductor layer 13 is higher than the density of the impurity atoms in the semiconductor layer 12. The density of the impurity atoms in the semiconductor layer 12 is, for example, $1.6 \times 10^{16}$ cm$^{-3}$ or less. The density of the impurity atoms in the semiconductor layer 13 is, for example, $8.5 \times 10^{18}$ cm$^{-3}$ or more, preferably, $1.0 \times 10^{19}$ cm$^{-3}$ or more. The density of the impurity atoms in the semiconductor layer 12 is an example of "first density". The density of the impurity atoms in the semiconductor layer 13 is an example of "second density".

The semiconductor layer 12 and the semiconductor layer 13 of the present embodiment have different electrical resistivities due to the different impurity densities. More specifically, the resistivity of the semiconductor layer 13 is lower than the resistivity of the semiconductor layer 12. The resistivity of the semiconductor layer 12 is, for example, 0.1 Ω·cm or more. The resistivity of the semiconductor layer 13 is, for example, 0.01 Ω·cm or less. The resistivity of the semiconductor layer 12 is an example of "first resistivity". The resistivity of the semiconductor layer 13 is an example of "second resistivity".

A thickness of the semiconductor layer 12 is, for example, 1 to 10 µm. Likewise, a thickness of the semiconductor layer is, for example, 1 to 10 µm. The thickness of the semiconductor layer 12 and the thickness of the semiconductor layer 13 may be the same or may be different from each other. In the present embodiment, the thickness of the semiconductor layer 13 is larger than the thickness of the semiconductor layer 12.

A density of the impurity atoms in the substrate 11 may be higher or lower than the density of the impurity atoms in the semiconductor layer 12. The density of the impurity atoms in the substrate 11 is, for example, $1.0 \times 10^{16}$ cm$^{-3}$ or less. Also, a resistivity of the substrate 11 may be higher or lower than the resistivity of the semiconductor layer 12. The resistivity of the substrate 11 is, for example, 1.0 Ω·cm or more.

Next, the semiconductor layer 13 is porosified (FIG. 1C). As a result, the semiconductor layer 13 turns into a porous semiconductor layer 14, which is a porous layer. The porosification of the semiconductor layer 13 may be performed by any method and, for example, is performed by metal-catalyzed wet etching or anodization. The porous semiconductor layer 14 is an example of "second semiconductor layer" and is also an example of "porous layer".

Although in the present embodiment, of the semiconductor layer 13 and the semiconductor layer 12, only the semiconductor layer 13 is porosified, both the semiconductor layer 13 and the semiconductor layer 12 may be porosified. Where both the semiconductor layer 13 and the semiconductor layer 12 are porosified, the semiconductor layer 12 may be only partially porosified or the semiconductor layer 12 may be entirely porosified. Also, although in the present embodiment, the semiconductor layer 13 is entirely porosified, the semiconductor layer 13 may be only partially be porosified.

When the semiconductor layer 13 is porosified, for example, the semiconductor layer 13 is heated. In this case, if the semiconductor layer 13 is an amorphous silicon layer, the porous semiconductor layer 14 may be a polysilicon layer as a result of the amorphous silicon layer turning to the polysilicon layer. The same applies to a case where the semiconductor layer 12 is porosified.

Each of the semiconductor layer 13 and the semiconductor layer 12 of the present embodiment is more easily porosified as the resistivity is lower. Therefore, the present embodiment makes it possible to selectively porosity only the semiconductor layer 13 of the semiconductor layer 13 and the semiconductor layer 12 by setting the resistivity of the semiconductor layer 13 to be lower than the resistivity of the semiconductor layer 12.

The impurity density, the resistivity and the thickness of the porous semiconductor layer 14 of the present embodiment, which exhibit no significant change due to the porosification, have respective values close to those of the impurity density, the resistivity and the thickness of semiconductor layer 13. Therefore, in many cases, various conditions relating to the semiconductor layer 13 described above hold also in the porous semiconductor layer 14. In other words, the density of the impurity atoms in the porous semiconductor layer 14 is higher than the density of the impurity atoms in the semiconductor layer 12 and the density of the impurity atoms in the porous semiconductor layer 14 is, for example, $8.5 \times 10^{18}$ cm$^{-3}$ or more (preferably, $1.0 \times 10^{19}$ cm$^{-3}$ or more). Also, the resistivity of the porous semiconductor layer 14 is lower than the resistivity of the semiconductor layer 12 and the resistivity of the porous semiconductor layer 14 is, for example, 0.01 Ω·cm or less. Also, the thickness of the porous semiconductor layer 14 is, for example, 1 to 10 µm. The same applies to the case where the semiconductor layer 12 of the present embodiment is porosified.

Figure 2A:
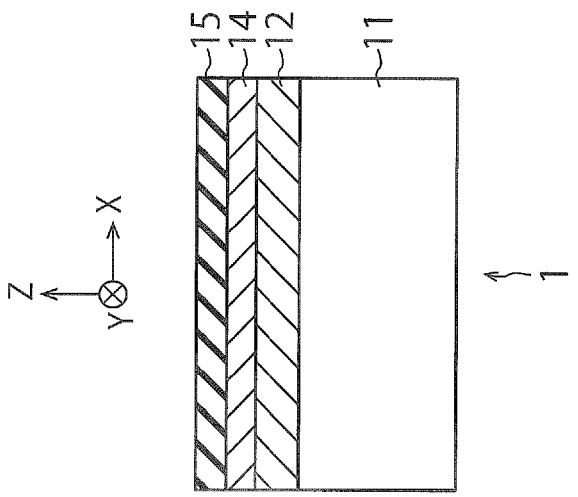

Next, a diffusion preventing layer 15 is formed on the porous semiconductor layer 14 (FIG. 2A). The diffusion preventing layer 15 of the present embodiment is formed to prevent diffusion of impurity atoms from the porous semiconductor layer 14, the semiconductor layer 12 and the substrate 11 to a layer to be formed on the diffusion preventing layer 15 later. The diffusion preventing layer 15 is, for example, a silicon oxide film, a silicon nitride film or an aluminum oxide film. A thickness of the diffusion preventing layer 15 is, for example, 10 to 100 nm. The diffusion preventing layer is an example of "third film".

Figure 2B:
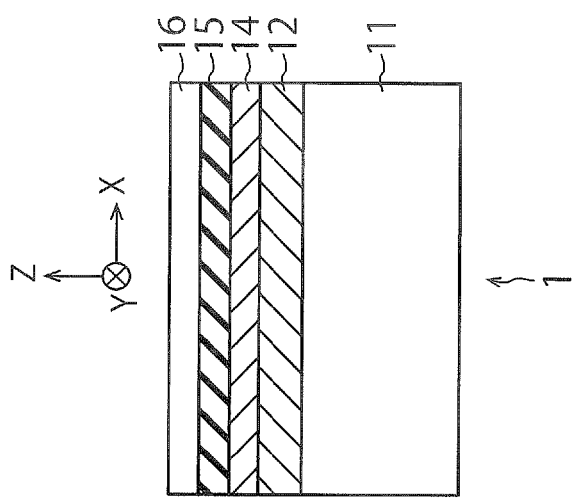

Next, a device layer 16 is formed on the diffusion preventing layer 15 (FIG. 2B). The device layer 16 is a layer including a device that is a component of the semiconductor device of the present embodiment. The device layer 16 includes, for example, a memory cell array for a 3D memory as such device. The device layer 16 is an example of "first film" and the device is an example of "first device".

Figure 2C:
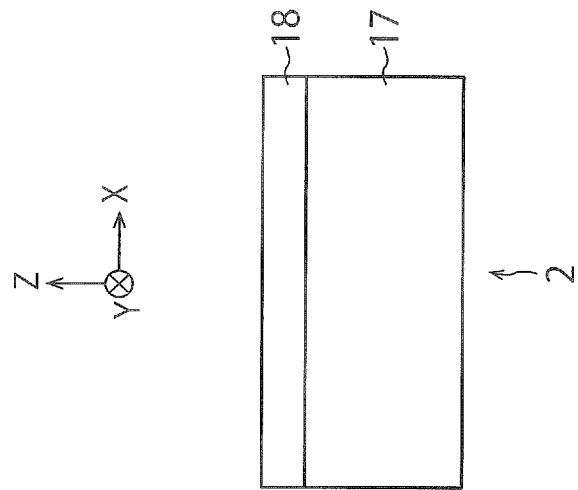

Next, a substrate 17 for a wafer 2 is provided and a device layer 18 is formed on the substrate 17 (FIG. 2C). The substrate 17 is, for example, a semiconductor substrate such as a silicon substrate. The substrate 17 of the present embodiment is a p-type substrate including B atoms as p-type impurity atoms but may be a p-type substrate including other p-type impurity atoms (for example, As atoms) or an n-type substrate including n-type impurity atoms (for example, P atoms or Al atoms). The device layer 18 is a layer including a device that is a component of the semiconductor device of the present embodiment. The device layer 18 includes, for example, a control circuit that controls operation of the memory cell array, as such device. The substrate 17 is an example of "second substrate". Also, the device layer 18 is an example of "second film" and the device is an example of "second device".

Figure 3C:
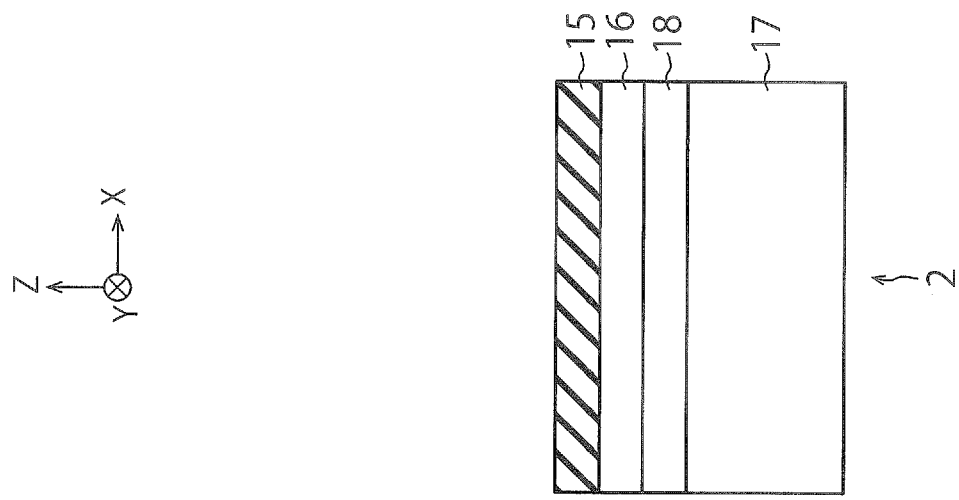
Figure 3B:
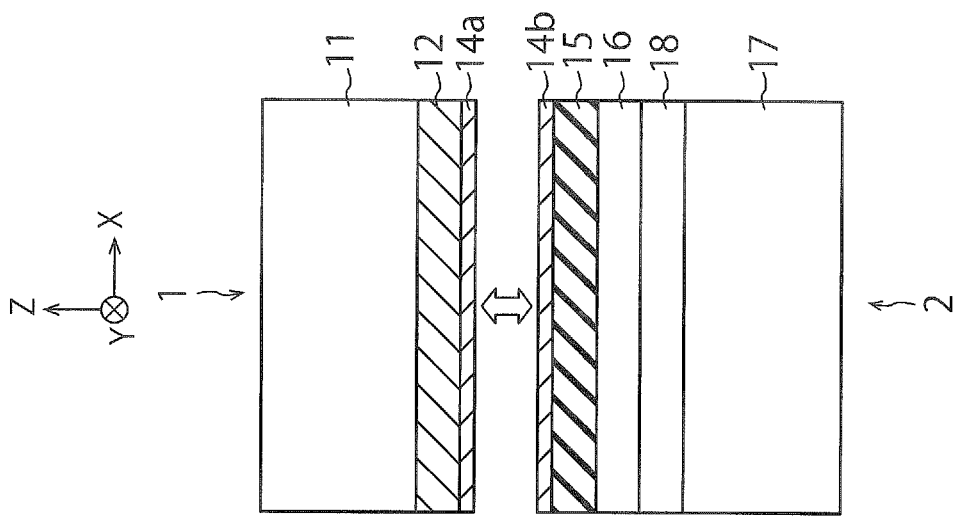
Figure 3A:
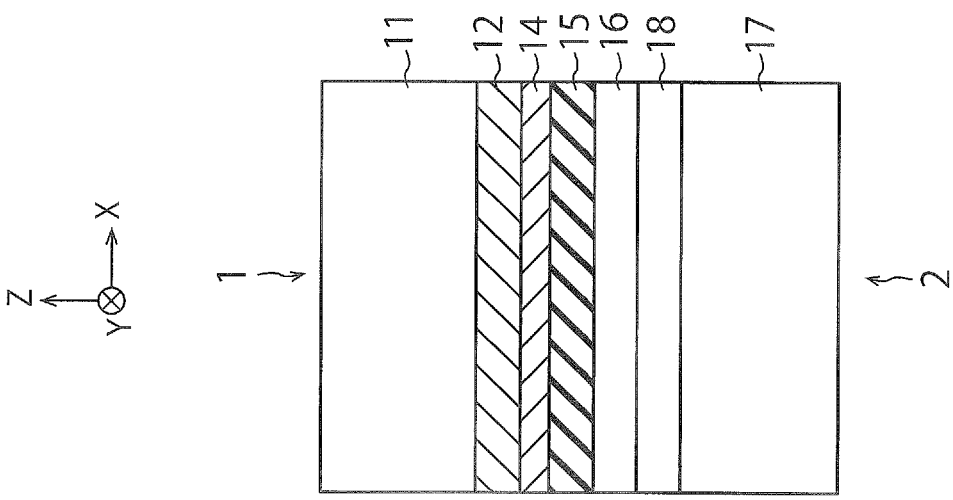

Next, the wafer 1 and the wafer 2 are bonded (FIG. 3A). More specifically, the substrate 11 and the substrate 17 are bonded to sandwich the semiconductor layer 12, the porous semiconductor layer 14, the diffusion preventing layer 15, the device layer 16 and the device layer 18. Consequently, the substrate 11 and the substrate 17 are bonded such that the device layer 16 and the device layer 18 are in contact with each other. Instead of facing each other to be in contact with each other, the device layer 16 and the device layer 18 may face each other via another layer. In FIG. 3A, the wafer 1 and the wafer 2 are bonded with the wafer 1 flipped vertically.

FIG. 3A is a stacked structure including the wafer 1 and the wafer 2. The stacked structure is divided into a plurality of chips by a later dicing step. Each chip is, for example, a 3D memory. The stacked structure and each of the chips after the dicing are examples of "semiconductor device".

Next, the wafer 1 and the wafer 2 are separated again from each other (FIG. 3B). However, the wafer 1 and the wafer 2 of the present embodiment are separated not at an interface between the device layer 16 and the device layer 18 but at a surface in the porous semiconductor layer 14 as a boundary. FIG. 3B illustrate a porous semiconductor layer 14a, which is a portion of the porous semiconductor layer 14, and a porous semiconductor layer 14b, which is a remaining portion of the porous semiconductor layer 14. The wafer 1 and the wafer 2 of the present embodiment are separated from each other such that the porous semiconductor layer 14 is divided into the porous semiconductor layer 14a and the porous semiconductor layer 14b. The porous semiconductor layer 14a is an example of "first portion" and the porous semiconductor layer 14b is an example of "second portion".

In the present embodiment, the substrate 11 and the substrate 17 are bonded in the step in FIG. 3A but are separated from each other again in the step in FIG. 3B. At this time, as described above, the porous semiconductor layer 14 is divided into the porous semiconductor layer 14a and the porous semiconductor layer 14b. As a result, the semiconductor layer 12 and the porous semiconductor layer 14a remain on the substrate 11, and the device layer 18, the device layer 16, the diffusion preventing layer 15 and the porous semiconductor layer 14b remain on the substrate 17.

In other words, in the step in FIG. 3B, the substrate 11 is peeled off from the substrate 17, together with the semiconductor layer 12 and the porous semiconductor layer 14a. A surface of the peel-off at this time is a surface in the porous semiconductor layer 14, that is, a surface between the porous semiconductor layer 14a and the porous semiconductor layer 14b.

A physical stiffness of the porous semiconductor layer 14 is lowered in comparison with the semiconductor layer 13 before the porosification. Therefore, the present embodiment makes it possible to easily separate the wafer 1 and the wafer 2 from each other at the surface in the porous semiconductor layer 14 as the boundary in the step in FIG. 3B. The surface may be located at any position in the porous semiconductor layer 14.

Next, the porous semiconductor layer 14b is removed from the wafer 2 (FIG. 3C). Subsequently, the wafer 2 is divided into a plurality of chips by the dicing step. Each of the chips of the present embodiment is, for example, a three-dimensional memory including the memory cell array in the device layer 16 and the control circuit in the device layer 18.

Figure 4A:
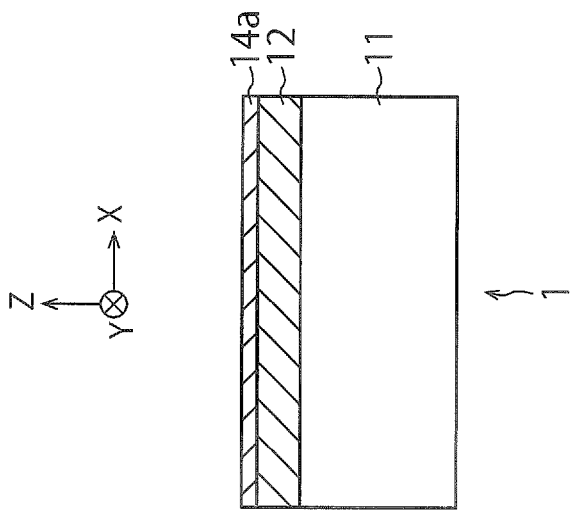
Figure 4B:
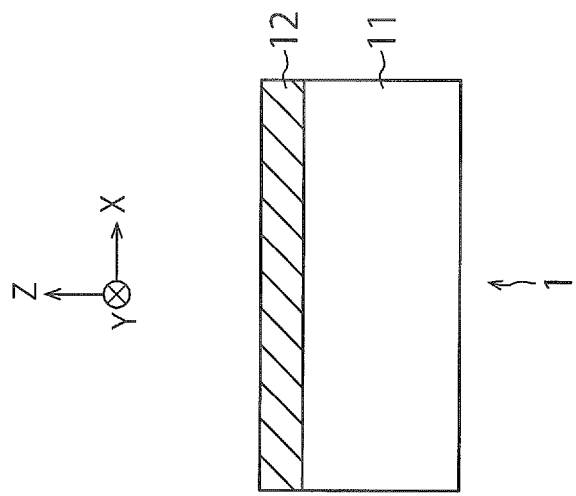

FIG. 4A illustrates the wafer 1 separated from the wafer 2. In the present method, next, the porous semiconductor layer 14a is removed from the wafer 1 (FIG. 4B). The porous semiconductor layer 14a is removed by, for example, wet etching. A chemical solution used in the wet etching is, for example, a mixed aqueous solution including HF (hydrofluoric acid), $HNO_3$ (nitric acid) and $CH_3COOH$ (acetic acid).

In the present embodiment, since the resistivity of the semiconductor layer 13 is set to be lower than the resistivity of the semiconductor layer 12, a resistivity of the porous semiconductor layer 14a is lower than the resistivity of the semiconductor layer 12. According to a test, an etching rate of the semiconductor layer 12 or the porous semiconductor layer 14a decreases as the resistivity of the semiconductor layer 12 or the porous semiconductor layer 14a increases. Therefore, the present embodiment makes it possible to setting the etching rate of the porous semiconductor layer 14a to be higher than the etching rate of the semiconductor layer 12 by setting the resistivity of the porous semiconductor layer 14a to be lower than the resistivity of the semiconductor layer 12, which makes it possible to selectively remove the porous semiconductor layer 14a in the step in FIG. 4B. Therefore, in the step in FIG. 4B, it is possible to remove the porous semiconductor layer 14a while making the semiconductor layer 12 remain.

Figure 4C:
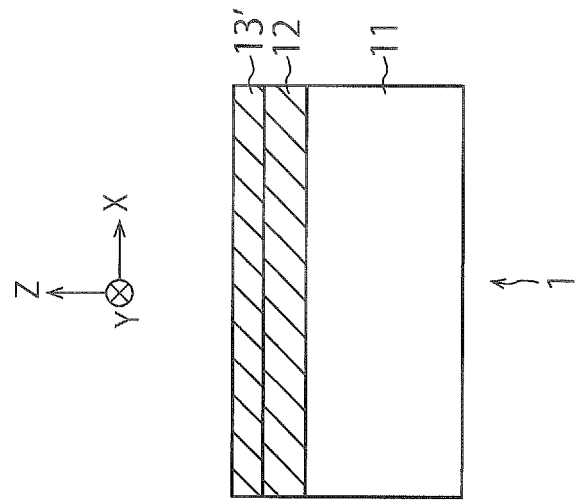

Next, a semiconductor layer 13' that is similar to the semiconductor layer 13 is formed on the semiconductor layer 12 remaining on the substrate 11 (FIG. 4C). Subsequently, the steps from FIG. 1C to 4B are performed again using the wafer 1 including the semiconductor layer 13'. This makes it possible to recycle the substrate 11 for the wafer 1 for semiconductor device manufacturing. For example, the method of the present embodiment is repeatedly performed using one substrate 11 and N substrates 17, which makes it possible to manufacture a plurality of chips (3D memories) from each of the N substrates 17 (N is an integer of two or more).

FIGS. 5A to 6C are sectional views illustrating a method of manufacturing a semiconductor device of a comparative example for the first embodiment.

Figure 5C:
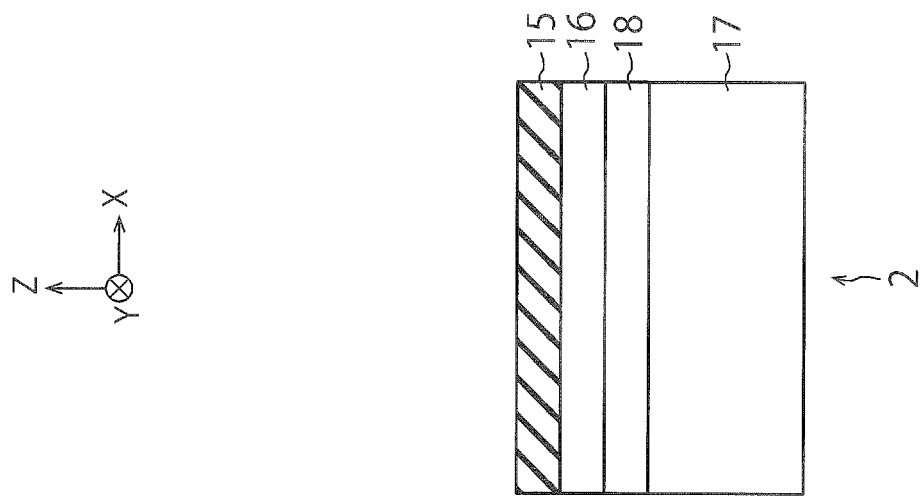
FIGS. 5A to 6C are sectional views illustrating a method of manufacturing a semiconductor device of a comparative example for the first embodiment.
Figure 5B:
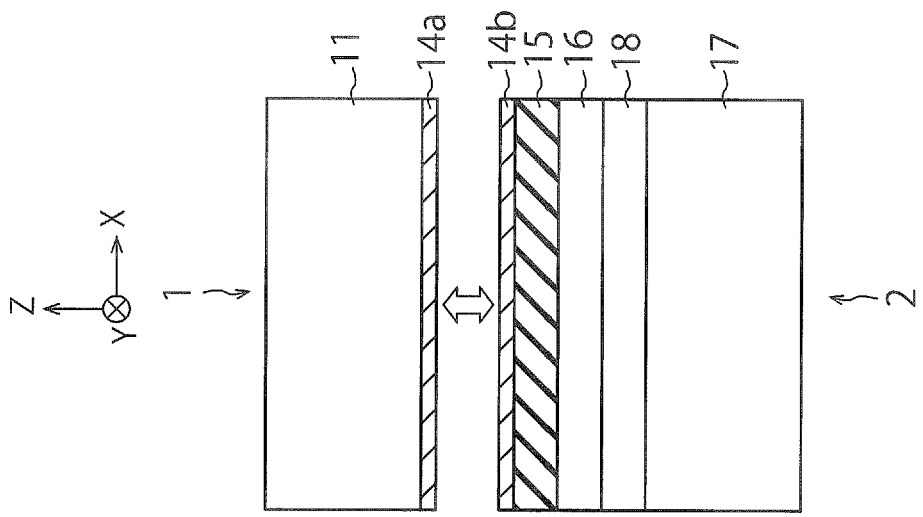
Figure 5A:
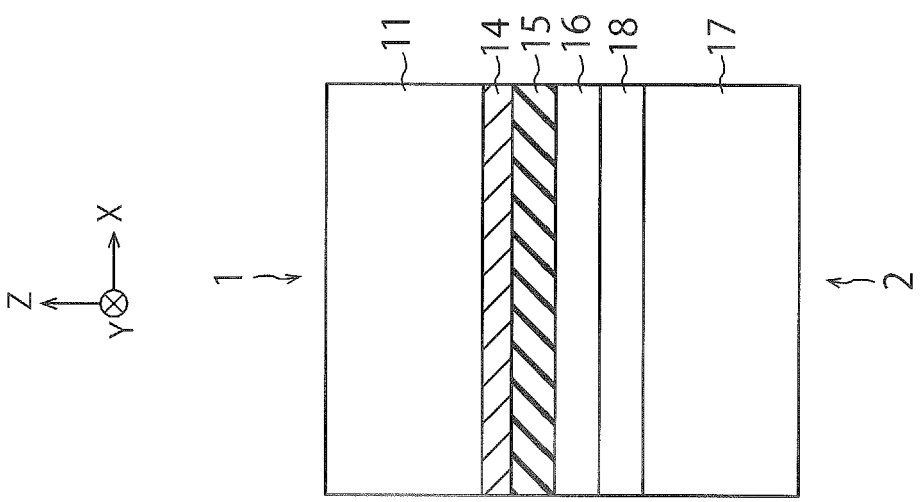

FIG. 5A is a sectional view corresponding to FIG. 3A. In FIG. 5A, a wafer 1 and a wafer 2 are bonded. It should be noted that the wafer 1 of the present comparative example includes no semiconductor layer 12.

Next, the wafer 1 and the wafer 2 are separated from each other again (FIG. 5B). The wafer 1 and the wafer 2 of the present comparative example are also separated from each other at a surface in a porous semiconductor layer 14 as a boundary. Therefore, the porous semiconductor layer 14 is divided into a porous semiconductor layer 14a and a porous semiconductor layer 14b. As a result, the porous semiconductor layer 14a remains on the substrate 11 and a device layer 18, a device layer 16, a diffusion preventing layer 15 and the porous semiconductor layer 14b remain on the substrate 17.

Next, the porous semiconductor layer 14b is removed from the wafer 2 (FIG. 5C). Subsequently, the wafer 2 is divided into a plurality of chips by a dicing step.

Figure 6A:
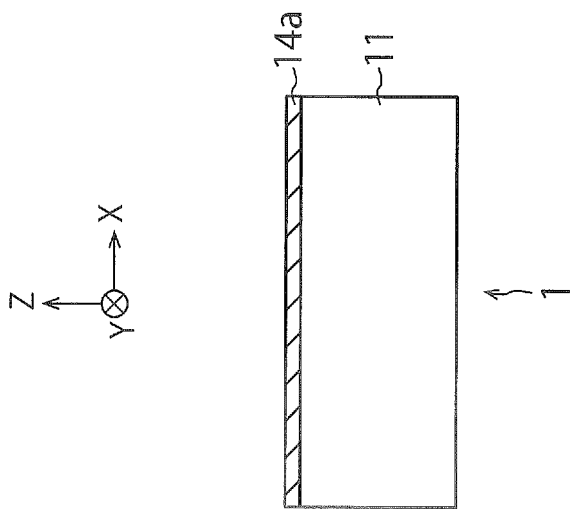
Figure 6B:
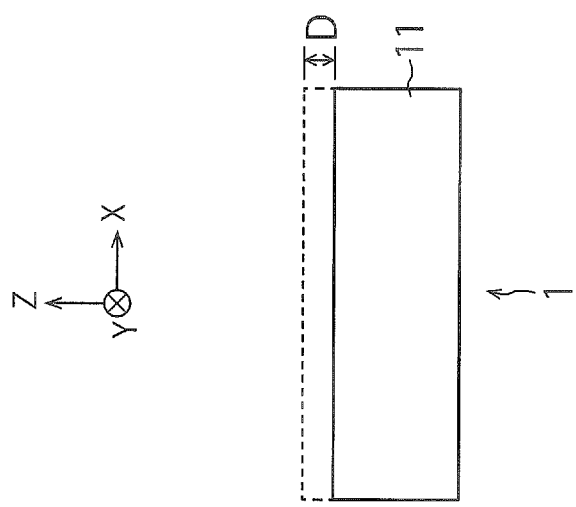

FIG. 6A illustrates the wafer 1 separated from the wafer 2. In the present comparative example method, next, the porous semiconductor layer 14a is removed from the wafer 1 (FIG. 6B). The porous semiconductor layer 14a is removed by, for example, wet etching.

At this time, because a surface of the substrate 11 is exposed as a result of the wet etching, the surface of the substrate 11 is likely to be adversely affected in some way, e.g., be damaged by the wet etching. Furthermore, where a density of B atoms in the substrate 11 is higher than a density of B atoms in the porous semiconductor layer 14a, a resistivity of the substrate 11 is lower than a resistivity of the porous semiconductor layer 14a and an etching rate of the substrate 11 is higher than an etching rate of the porous semiconductor layer 14a. As a result, the substrate 11 is likely to be thinned by the wet etching. FIG. 6B illustrates the substrate 11 with a thickness reduced by a thickness D because of thinning.

Figure 6C:
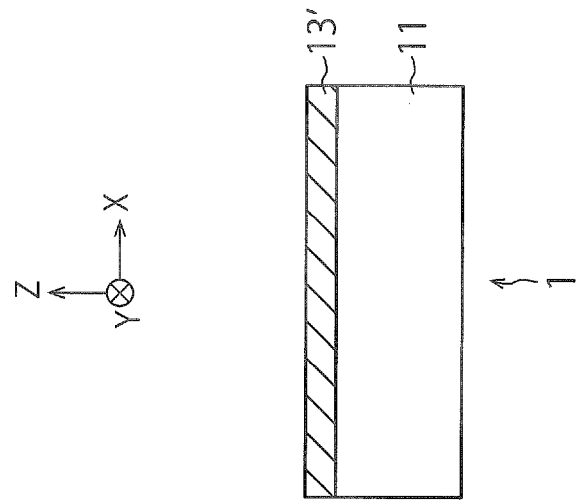

Next, a semiconductor layer 13' that is similar to a semiconductor layer 13 is formed on the substrate 11 (FIG. 6C). Subsequently, the steps from FIGS. 5A to 6B are performed again using the wafer 1 including the semiconductor layer 13'. In this case, if a surface of the substrate 11 is damaged, or the substrate 11 is thinned, by wet etching, recycling of the substrate 11 may be hindered. In the present embodiment, the porous semiconductor layer 14a is provided on the substrate 11 via the semiconductor layer 12. This makes it possible to curb damage of the surface of the substrate 11 and thinning of the substrate 11 due to wet etching. Therefore, it is possible to remove the porous semiconductor layer 14a from the substrate 11 to facilitate recycling of the substrate 11.

Figure 7:
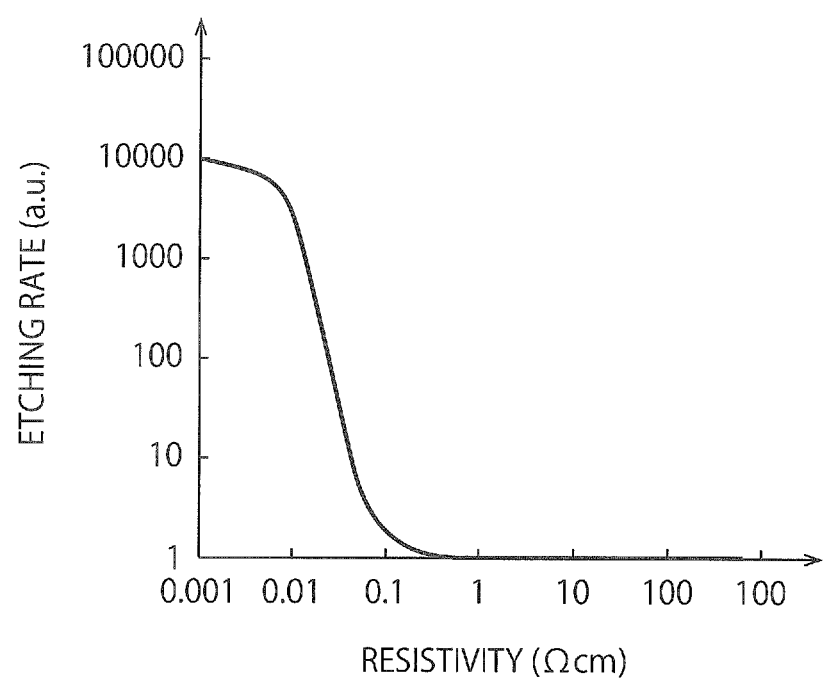
FIG. 7 is a graph for describing the method of manufacturing the semiconductor device of the first embodiment.

FIG. 7 is a graph for describing the method of manufacturing the semiconductor device of the first embodiment.

In FIG. 7, the abscissa axis represents the resistivity of the semiconductor layer 12 or the porous semiconductor layer 14a and the ordinate axis represents the etching rate of the semiconductor layer 12 or the porous semiconductor layer 14a. FIG. 7 indicates a relationship between the resistivity and the etching rate where the semiconductor layer 12 or the porous semiconductor layer 14a is etched using a mixed aqueous solution including HF, $HNO_3$ and $CH_3COOH$. As illustrated in FIG. 7, the etching rate of the semiconductor layer 12 or the porous semiconductor layer 14a decreases as the resistivity of the semiconductor layer 12 or porous semiconductor layer 14a increases. Therefore, the present embodiment makes it possible to selectively remove the porous semiconductor layer 14a in the step in FIG. 4B.

According to FIG. 7, it should be noted that the etching rate largely varies during variation of the resistivity from 0.01 Ω·cm to 0.1 Ω·cm. Therefore, the present embodiment makes it possible to, when the porous semiconductor layer 14a is removed, effectively curb removal of the semiconductor layer 12, by setting the resistivity of the semiconductor layer 12 to 0.1 Ω·cm or more and setting the resistivity of the semiconductor layer 13 to 0.01 Ω·cm or less.

As above, in the present embodiment, the semiconductor layer 13 is formed on the substrate 11 via the semiconductor layer 12 and the semiconductor layer 13 is porosified. Furthermore, after the substrate 11 and the substrate 17 being bonded, the substrate 11 and the substrate 17 are separated from each other. Therefore, the present embodiment makes it possible to separate the substrate 11 and the substrate 17 bonded from each other in a favorable manner. For example, it is possible to easily separate the substrate 11 and the substrate 17 from each other at a surface in the porous semiconductor layer 14 as a boundary and remove the porous semiconductor layer 14a from the substrate 11 in a manner suitable for recycling of the substrate 11.

Second Embodiment

Figure 8:
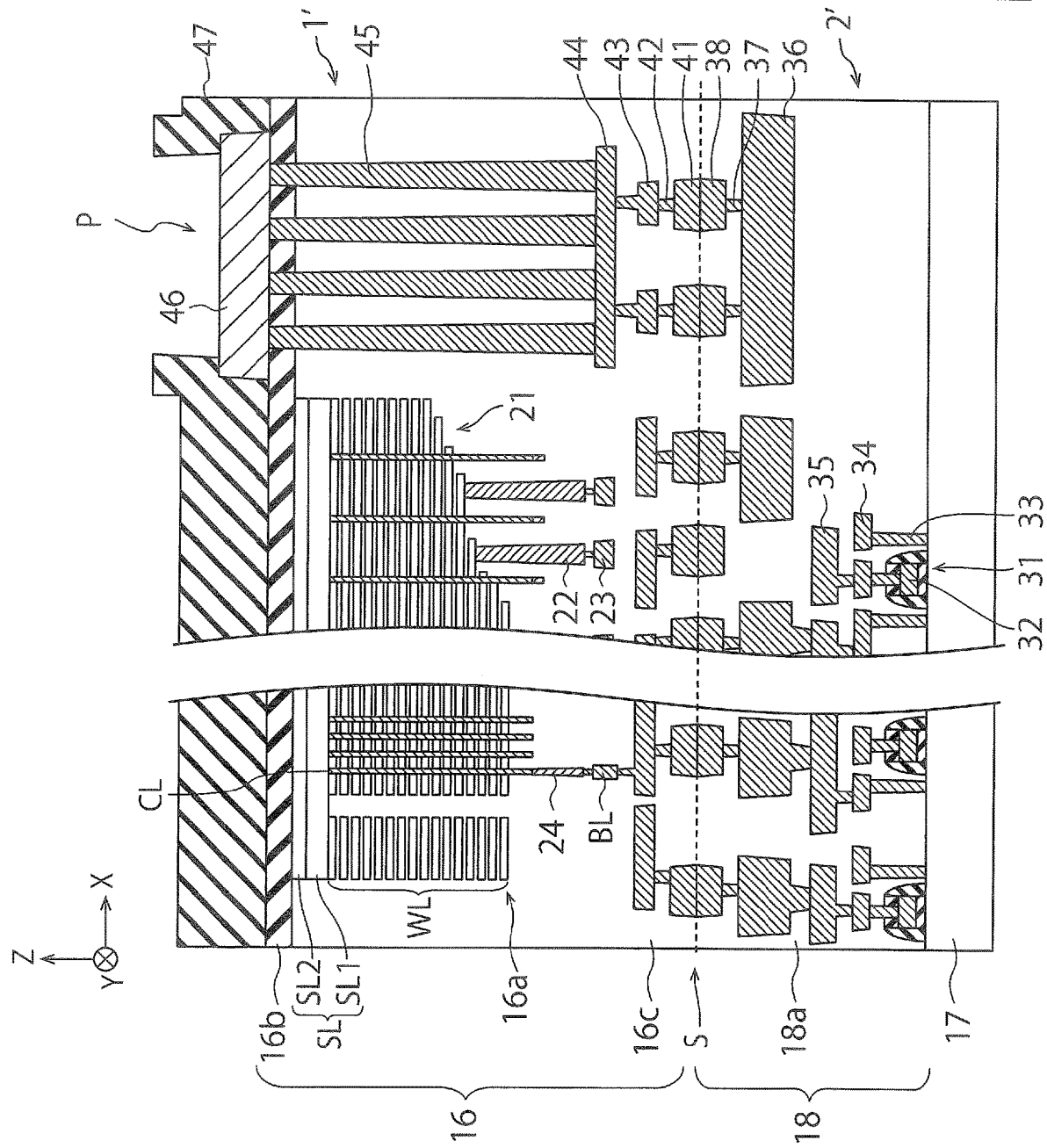
FIG. 8 is a sectional view illustrating a structure of a semiconductor device of a second embodiment.

FIG. 8 is a sectional view illustrating a structure of a semiconductor device of a second embodiment. FIG. 8 illustrates an example of a semiconductor device manufactured by the method of the first embodiment. The semiconductor device in FIG. 8 is a 3D memory in which an array region 1' derived from a wafer 1 and a circuit region 2' derived from a wafer 2 are bonded.

The array region 1' includes a device layer 16. The device layer 16 of the present embodiment includes a memory cell array 16a including a plurality of memory cells, an insulator 16b above the memory cell array 16a and an inter layer dielectric 16c below the memory cell array 16a. The insulator 16b is, for example, a silicon oxide film or a silicon nitride film. The inter layer dielectric 16c is, for example, a silicon oxide film or a stacked film including a silicon oxide film and another insulator.

The circuit region 2' is provided below the array region 1'. Sign S indicates a surface of bonding between the array region 1' and the circuit region 2'. The circuit region 2' includes a device layer 18 and a substrate 17 below the device layer 18. The device layer 18 of the present embodiment includes an inter layer dielectric 18a between the inter layer dielectric 16c and the substrate 17. The inter layer dielectric 18a is, for example, a silicon oxide film or a stacked film including a silicon oxide film and another insulator.

The array region 1' includes a plurality of word lines WL and a source line SL as a plurality of electrode layers in the memory cell array 16a. FIG. 8 illustrates a staircase structure portion 21 of the memory cell array 16a. The word lines WL are electrically connected to a word line layer 23 via respective contact plugs 22. Columnar portions CL that extend through the plurality of word lines WL are electrically connected to respective bit lines BL via respective plugs 24 and are electrically connected to the source line SL. The source line SL includes a first layer SL1 that is a semiconductor layer and a second layer SL2 that is a metal layer.

The circuit region 2' includes a plurality of transistors 31. Each transistor 31 includes a gate electrode 32 provided on the substrate 17 via a gate insulator, and a non-illustrated source diffusion layer and a non-illustrated drain diffusion layer provided in the substrate 17. Also, the circuit region 2' includes a plurality of contact plugs 33 each provided on the gate electrode 32, the source diffusion layer or the drain diffusion layer of the relevant transistor 31, an interconnect layer 34 that is provided on the contact plugs 33 and that includes a plurality of interconnects, and an interconnect layer 35 that is provided on the interconnect layer 34 and that includes a plurality of interconnects.

The circuit region 2' further includes an interconnect layer 36 that is provided on the interconnect layer 35 and that includes a plurality of interconnects, a plurality of via plugs 37 provided on the interconnect layer 36, and a plurality of metal pads 38 provided on the via plugs 37. The metal pads 38 are, for example, a Cu (copper) layer or an Al (aluminum) layer. The circuit region 2' functions as a control circuit (logic circuit) that controls operation of the array region 1'. The control circuit is formed by, e.g., the transistors 31 and is electrically connected to the metal pads 38.

The array region 1' includes a plurality of metal pads 41 provided on the metal pads 38 and a plurality of via plugs 42 provided on the metal pads 41. Also, the array region 1' includes an interconnect layer 43 that is provided on the via plugs 42 and that includes a plurality of interconnects and an interconnect layer 44 that is provided on the interconnect layer 43 and that includes a plurality of interconnects. The metal pads 41 are, for example, a Cu layer or an Al layer. The above-described bit lines BL are included in the interconnect layer 44. Also, the above-described control circuit is electrically connected to the memory cell array 16a via, e.g., the metal pads 41, 38, and controls operation of the memory cell array 16a via, e.g., the metal pads 41, 38.

The array region 1' further includes a plurality of via plugs 45 provided on the interconnect layer 44, a metal pad 46 provided on the via plugs 45 and the insulator 16b, and a passivation film 47 provided on the metal pad 46 and the insulator 16b. The metal pad 46 is, for example, a Cu layer or an Al layer and function as an external connection pad (bonding pad) of the semiconductor device in FIG. 8. The passivation film 47 is, for example, an insulator such as a silicon oxide film and includes an opening portion P through which the upper face of the metal pad 46 is exposed. The metal pad 46 can be connected to a mounting board or another device via the opening portion P by, e.g., a bonding wire, a solder ball or a metal bump.

Figure 9:
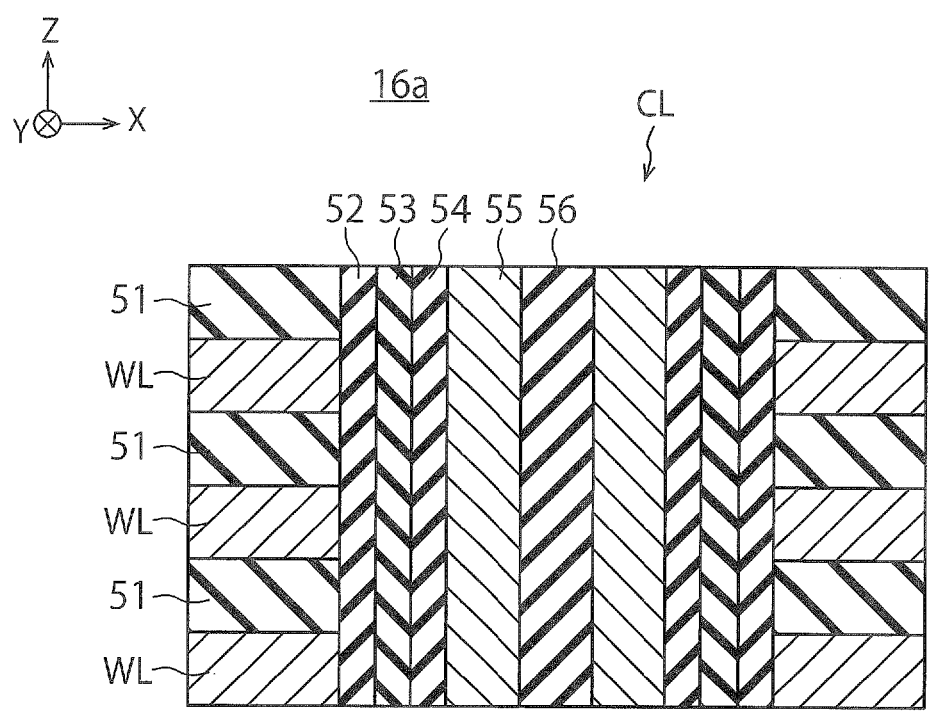
FIG. 9 is a sectional view illustrating a structure of a columnar portion of the second embodiment.

FIG. 9 is a sectional view illustrating a structure of a columnar portion CL of the second embodiment.

As illustrated in FIG. 9, the memory cell array 16a includes the plurality of word lines WL and a plurality of insulating layers 51 stacked alternately on the inter layer dielectric 16c (FIG. 8). Each word line WL is, for example, a W (tungsten) layer. Each insulating layer 51 is, for example, a silicon oxide film.

The columnar portion CL includes a block insulator 52, a charge storage layer 53, a tunnel insulator 54, a channel semiconductor layer 55 and a core insulator 56 in the order mentioned. The charge storage layer 53 is, for example, a silicon nitride film and is formed on side faces of the word lines WL and the insulating layers 51 via the block insulator 52. The charge storage layer 53 may be a semiconductor layer such as a polysilicon layer. The channel semiconductor layer 55 is, for example, a polysilicon layer and is formed on a side face of the charge storage layer 53 via the tunnel insulator 54. Each of the block insulator 52, the tunnel insulator 54 and the core insulator 56 is, for example, a silicon oxide film or a metal insulator.

Figure 10:
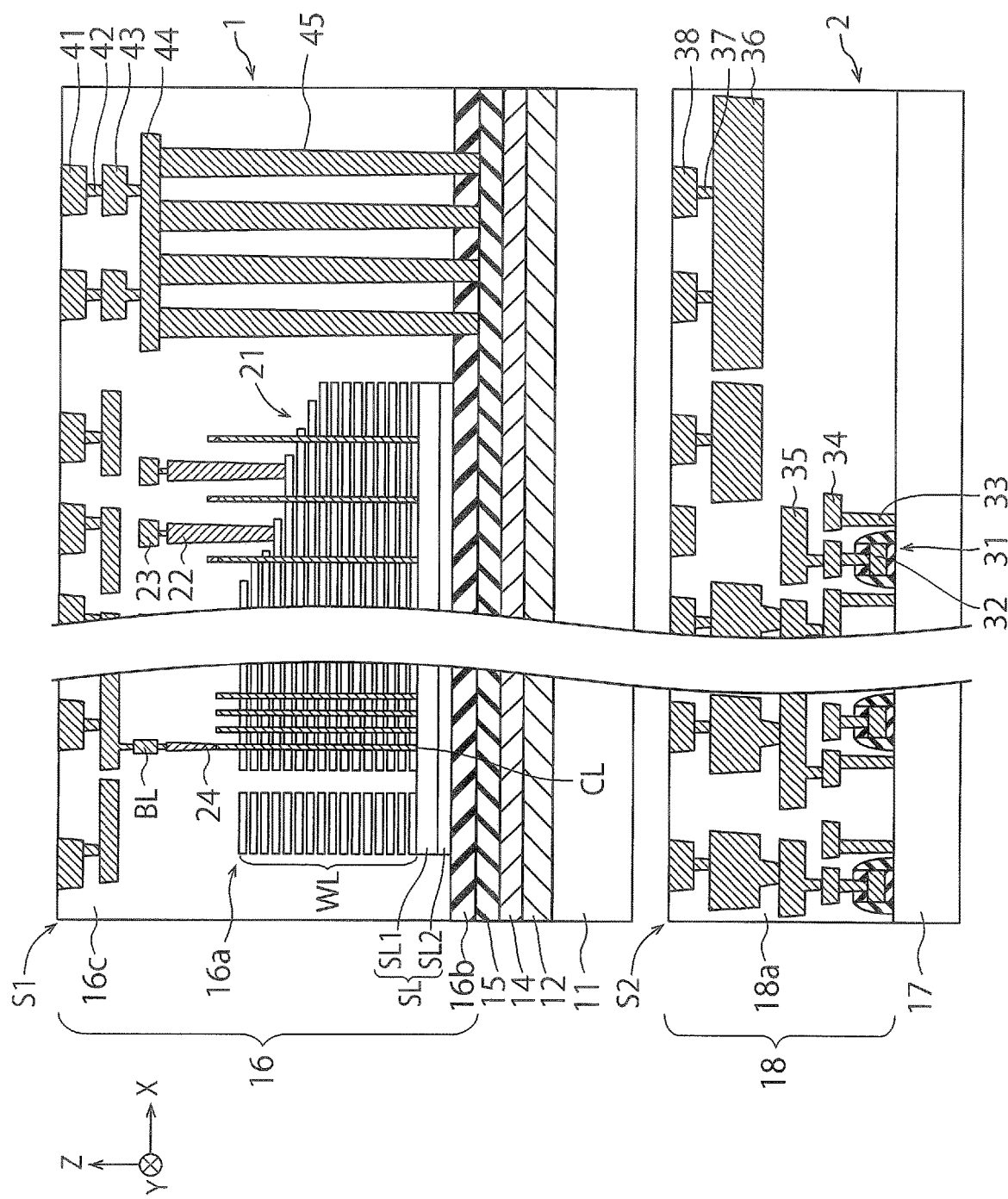
FIG. 10 is a sectional view illustrating a method of manufacturing the semiconductor device of the second embodiment.

FIG. 10 is a sectional view illustrating a method of manufacturing the semiconductor device of the second embodiment.

FIG. 10 illustrates a wafer 1 including a plurality of array regions 1' and a wafer 2 including a plurality of circuit regions 2'. The wafer 1 is called an array wafer or a memory wafer and the wafer 2 is called a circuit wafer or a CMOS wafer.

It should be noted that a direction of the wafer 1 in FIG. 10 is opposite to the direction of the array region 1' in FIG. 8. In the present embodiment, a semiconductor device is manufactured by bonding the wafer 1 and the wafer 2. FIG. 10 illustrates the wafer 1 before reversal of the direction for bonding and FIG. 8 illustrates the array region 1' after reversal of the direction for bonding, bonding and dicing.

In FIG. 10, sign S1 denotes an upper face of the wafer 1 and sign S2 denotes an upper face of the wafer 2. It should be noted that the wafer 1 includes a substrate 11 provided below an insulator 16b via a diffusion preventing layer 15, a porous semiconductor layer 14 and a semiconductor layer 12.

In the present embodiment, first, as illustrated in FIG. 10, e.g., the semiconductor layer 12, the porous semiconductor layer 14, the diffusion preventing layer 15, the insulator 16b, a memory cell array 16a, an inter layer dielectric 16c, a staircase structure portion 21 and metal pads 41 are formed on the substrate 11 of the wafer 1, and, e.g., an inter layer dielectric 18a, transistors 31 and metal pads 38 are formed on a substrate 17 of the wafer 2. For example, via plugs 45, an interconnect layer 44, an interconnect layer 43, via plugs 42 and metal pads 41 are sequentially formed on the substrate 11. Furthermore, contact plugs 33, an interconnect layer 34, an interconnect layer 35, an interconnect layer 36, via plugs 37 and metal pads 38 are sequentially formed on the substrate 17.

Next, as illustrated in FIG. 8, the wafer 1 and the wafer 2 are bonded by mechanical pressure. Consequently, the inter layer dielectric 16c and the inter layer dielectric 18a are bonded to each other. Next, the wafer 1 and the wafer 2 are annealed at 400° C. Consequently, the metal pads 41 and the metal pads 38 are joined to each other.

Subsequently, after the substrate 11 and the substrate 17 being separated from each other at a surface in the porous semiconductor layer 14 as a boundary, the substrate 17 and various layers on the substrate 17 are cut into a plurality of chips. In this way, the semiconductor device in FIG. 8 is manufactured. The metal pad 46 and the passivation film 47 are formed on the insulator 16b, for example, after the substrate 11 and the substrate 17 being separated from each other and the porous semiconductor layer 14b and the diffusion preventing layer 15 on the substrate 17 being removed.

As above, the present embodiment makes it possible to manufacture the semiconductor device including the array region 1' derived from the wafer 1 and the circuit region 2' derived from the wafer 2 by the method of the first embodiment. The present embodiment makes it possible to, when such semiconductor device is manufactured, separate the substrate 11 and the substrate 17 bonded from each other in a favorable manner.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
   forming a first semiconductor layer including impurity atoms with a first density, on a first substrate;
   forming a second semiconductor layer including impurity atoms with a second density that is higher than the first density, on the first semiconductor layer, the second semiconductor layer being an amorphous layer or a polycrystalline layer;
   forming a porous layer resulting from porosification of at least a portion of the second semiconductor layer;
   forming a first film including a memory cell array as a first device, on the porous layer;
   providing a second substrate provided with a second film including a second device;
   bonding the first substrate and the second substrate to sandwich the first film and the second film; and
   separating the first substrate and the second substrate from each other such that a first portion of the porous layer remains on the first substrate and a second portion of the porous layer remains on the second substrate.

2. The method of claim 1, wherein a density of the impurity atoms in the first semiconductor layer is $1.6 \times 10^{16}$ $cm^{-3}$ or less.

3. The method of claim 1, wherein a density of the impurity atoms in the second semiconductor layer is $8.5 \times 10^{18}$ $cm^{-3}$ or more.

4. The method of claim 1, wherein the impurity atoms in the first semiconductor layer and the impurity atoms in the second semiconductor layer are a same kind of impurity atoms.

5. The method of claim 1, wherein:
   the first semiconductor layer has a first resistivity; and
   the second semiconductor layer has a second resistivity that is lower than the first resistivity.

6. The method of claim 5, wherein the first resistivity is 0.1 Ω·cm or more.

7. The method of claim 5, wherein the second resistivity is 0.01 Ω·cm or less.

8. The method of claim 1, further comprising removing the first portion from the first substrate to recycle the first substrate.

9. The method of claim 8, wherein the first portion is removed from the first substrate by wet etching.

10. The method of claim 1, wherein the second film includes a control circuit that controls the memory cell array, as the second device.

11. The method of claim 1, wherein the first substrate and the second substrate are separated from each other such that the first semiconductor layer and the first portion remain on the first substrate and the second portion, the first film and the second film remain on the second substrate.

12. The method of claim 1, wherein the second semiconductor layer is a polycrystalline layer.

13. A method of manufacturing a semiconductor device, comprising:
forming a first semiconductor layer including impurity atoms with a first density, on a first substrate;
forming a second semiconductor layer including impurity atoms with a second density that is higher than the first density, on the first semiconductor layer, the second semiconductor layer being an amorphous layer or a polycrystalline layer;
forming a porous layer resulting from porosification of at least a portion of the second semiconductor layer;
forming a first film including a first device, on the porous layer;
providing a second substrate provided with a second film including a second device;
bonding the first substrate and the second substrate to sandwich the first film and the second film; and
separating the first substrate and the second substrate from each other such that a first portion of the porous layer remains on the first substrate and a second portion of the porous layer remains on the second substrate,
wherein the first film is formed on the second semiconductor layer via a third film that prevents diffusion of the impurity atoms from the first and second semiconductor layers to the first film.

14. A method of manufacturing a semiconductor device, comprising:
forming a first semiconductor layer including impurity atoms with a first density, on a first substrate;
forming a second semiconductor layer including impurity atoms with a second density that is higher than the first density, on the first semiconductor layer, the second semiconductor layer being an amorphous layer;
forming a porous layer resulting from porosification of at least a portion of the second semiconductor layer;
forming a first film including a first device, on the porous layer;
providing a second substrate provided with a second film including a second device;
bonding the first substrate and the second substrate to sandwich the first film and the second film; and
separating the first substrate and the second substrate from each other such that a first portion of the porous layer remains on the first substrate and a second portion of the porous layer remains on the second substrate.

* * * * *